(12) United States Patent
Gupta et al.

(10) Patent No.: US 7,101,466 B2
(45) Date of Patent: Sep. 5, 2006

(54) LINEAR SWEEPING MAGNETRON SPUTTERING CATHODE AND SCANNING IN-LINE SYSTEM FOR ARC-FREE REACTIVE DEPOSITION AND HIGH TARGET UTILIZATION

(75) Inventors: Subhadra Gupta, Tuscaloosa, AL (US); Andrew Ruspini, Hillsdale, NJ (US)

(73) Assignee: KDF Electronic + Vacuum Services Inc, Rockleigh, NJ (US)

( * ) Notice: Subject to any disclaimer, the term of this patent is extended or adjusted under 35 U.S.C. 154(b) by 45 days.

(21) Appl. No.: 10/667,202

(22) Filed: Sep. 19, 2003

(65) Prior Publication Data
US 2005/0061666 A1    Mar. 24, 2005

(51) Int. Cl.
*C23C 14/35*    (2006.01)
(52) U.S. Cl. .............................. 204/298.2; 204/298.22; 204/298.09
(58) Field of Classification Search ............. 204/298.2, 204/298.22, 298.12, 298.13, 298.19, 298.09
See application file for complete search history.

(56) References Cited

U.S. PATENT DOCUMENTS

| | | | | |
|---|---|---|---|---|
| 5,026,471 A * | 6/1991 | Latz et al. | ............. | 204/298.19 |
| 5,865,970 A * | 2/1999 | Stelter | ................... | 204/298.19 |
| 6,258,217 B1 * | 7/2001 | Richards et al. | ........ | 204/192.12 |
| 6,322,679 B1 * | 11/2001 | De Bosscher et al. | ... | 204/298.2 |
| 6,641,701 B1 * | 11/2003 | Tepman | ................... | 204/192.1 |

* cited by examiner

*Primary Examiner*—Rodney G. McDonald
(74) *Attorney, Agent, or Firm*—Thomas A. O'Rourke; Bodner & O'Rourke, LLP

(57) ABSTRACT

A sweeping linear magnetron is described. The magnetron has a cathode backing plate, a drive housing attached to the cathode backing plate and a motor held in the drive housing. The motor drives a yoke positioned within a cut-out in the backing plate. The yoke has a magnet pack attached thereto said yoke such that the magnet pack is adapted to being moved over a target material and wherein the target material is being sputtered within a vacuum chamber onto a substrate.

25 Claims, 15 Drawing Sheets

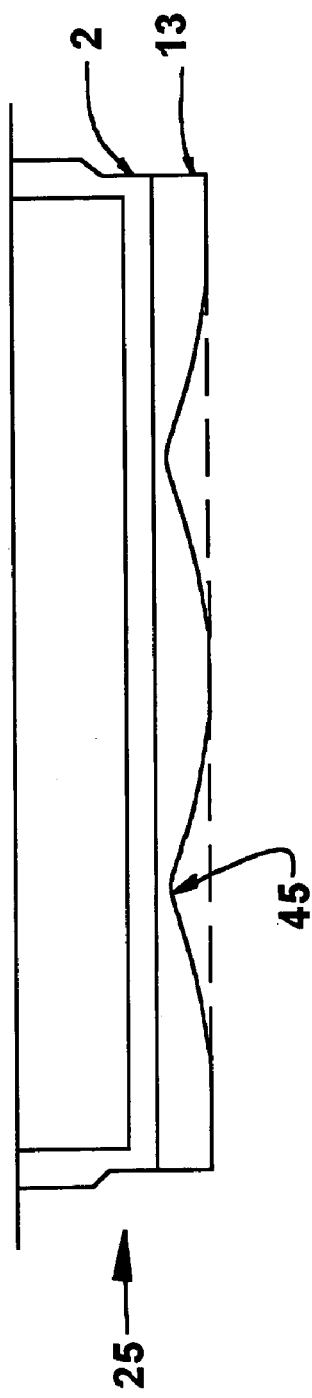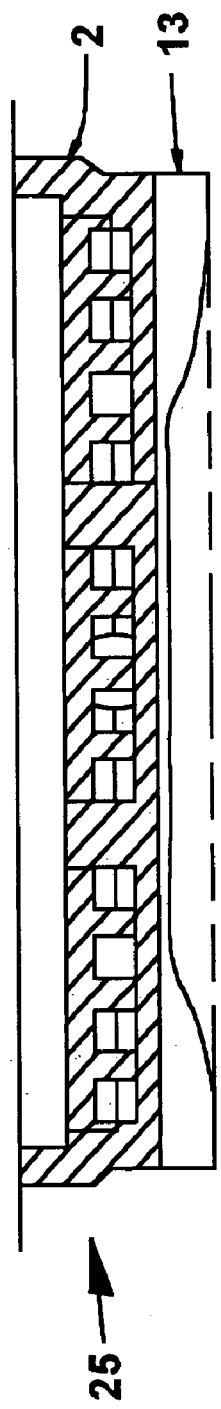
FIG. 6A
PRIOR ART
FIG. 6B

THEORETICAL SIMULATION OF OXIDE FILM STEP COVERAGE ACHIEVED BY PRIOR ART.

LINEAR SWEEPING MAGNETRON SPUTTERING CATHODE AND SCANNING IN-LINE SYSTEM FOR ARC-FREE REACTIVE DEPOSITION AND HIGH TARGET UTILIZATION

FIELD OF THE INVENTION

The present invention relates generally to sputtering, and more particularly to a linear moving magnetron sputtering cathode, which sweeps a magnetron plasma across a target face, incorporated in a batch scanning sputter tool, for achieving nearly full-face or full-face, uniform target erosion that results in arc-free reactive deposition and high, or total, target utilization.

BACKGROUND OF THE INVENTION

Thin dielectric films are utilized in a wide variety of device applications, ranging from protective layers in semiconductor circuits, computer read-write heads, magnetic media, and displays, to components in optical waveguides, mirrors, filters and switches. What is common about all these applications is that these dielectric layers must be as free from defects as possible so that they provide a high level of insulation between current-carrying conductors sandwiched around them.

For many applications fairly thick (several microns) dielectric films are required, so it is desirable to have a production-worthy deposition scheme that will be capable of producing high quality dielectric films at high rates. Traditionally, RF diode or RF magnetron sputtering from insulating targets is used for dielectric coating. However, the deposition rates afforded by such techniques is extremely low, and it can take several hours to deposit even a relatively thin film. Another disadvantage of RF sputtering is that the process is very hot, and can damage fragile substrates.

DC reactive magnetron sputtering from metallic targets is an excellent way of boosting dielectric deposition rates. Advantages of this technique over RF include 1) 5–10 times higher rates, 2) cooler processes, 3) less flaking from metallic targets, leading to lower defect densities on the substrate, provided arcing is well-suppressed, and 4) simpler and less expensive power supplies. The main disadvantage is that, for a magnetron cathode which has a limited area of erosion, DC reactive sputtering leads to dielectric layer buildup on areas of the target that are not eroded. This in turn leads to arcing, particles and defect formation in the deposited films. An advanced arc-suppression scheme, such as that utilized in Advanced Energy's Pinnacle Plus switching power supply, needs to be used for DC reactive deposition of dielectric films from conventional cathodes. However, such power supplies approach the expense and complexity of a RF scheme.

It is, therefore, critically important in DC reactive deposition of dielectric films to have a cathode that provides full-face erosion of the target surface. A moving magnetron cathode is one of the best ways of achieving such full-face erosion. An example of such a cathode that has been successfully utilized for arc-free DC reactive deposition of dielectric films is S. Hurwitt's U.S. Pat. No. 5,130,005, which describes a rotating magnetron scheme for a circular cathode. However, this cathode cannot be utilized in a scanning, in-line batch tool. Another moving magnetron patent has been issued to McKelvey in U.S. Pat. No. 4,422,916, which describes a rotating cylindrical magnetron. The disadvantage of this type of cathode is that it is very difficult to fabricate cylindrical targets from brittle materials. A rectangular planar magnetron with a moveable magnet assembly is known from U.S. Pat. No. 4,444,643, in which the magnetic assembly is translated laterally and parallel to the major axis of the target. DE-A-27 07 144 proposes a magnet assembly which is swept over a rectangular target along a linear path. U.S. Pat. No. 4,714,536 proposes that the magnet assembly is moved with a non-repetitive small epicycloidal motion distributed over the area of the target. U.S. Pat. No. 5,188,717 explains that even erosion of the target can be obtained when the dwell time of the magnetic flux remains equal over each unit area of the target and proposes a specific shape to the magnet assembly. U.S. Pat. No. 5,382,344 describes a magnet assembly which produces electron paths in a plurality of racetracks which are moved linearly and perpendicularly to the longest axis of the target with an oscillatory motion. EP-A-416 241 describes a magnet array which may be moved in an oscillating motion limited by the cathode tray, the motion being produced by a pin on a rotating cam, the pin being journalled in the base of the rotating cam. U.S. Pat. No. 5,328,585 describes a linear planar-magnetron cathode with a reciprocating magnet array, where the reciprocating motion can be simultaneously lateral and longitudinal with respect to the cathode. U.S. Pat. No. 5,833,815 proposes reciprocating motions parallel to the substrate moving direction and at an angle thereto. U.S. Pat. No. 5,417,833 discusses previous attempts to achieve full target erosion, and combines a rotating permanent magnet array with an stationary electromagnet. This scheme is extremely complex and difficult to apply to a wide range of applications. U.S. Pat. No. 6,494,999 describes a magnetron cathode assembly that can be scanned over the target assembly, independent of vacuum or vacuum components. The target assembly includes heating/cooling passages and a heat exchanger/pressure relieving plate. The patent describes much more about the integral cooling and pressure relief mechanism than the actual magnet design and performance of the cathode. U.S. Pat. No. 6,416,639 reviews most of the aforementioned patents and describes a technique for combining a moving magnet array with fixed ferromagnetic pole pieces to smooth out the erosion profile.

The object of the present invention is to provide a simple, practical and effective means of achieving near-complete target erosion over a rectangular cathode in an in-line batch sputtering system. This means should be applicable to a wide range of target materials and processes. In particular, DC reactive sputtering of dielectrics should be easily effected without recourse to expensive and complex arc-suppression circuitry. Target utilization should be over 70%, thus providing a cost-effective solution for the use of precious metal and other expensive targets.

OBJECTS OF THE INVENTION

It is an object of the present invention to provide a magnetron sputtering device that will allow for full-face target erosion in a sputter deposition plasma process.

It is an object of the present invention to provide a magnetron sputtering device that will allow for arc-free DC reactive deposition of insulative and dielectric films.

It is an object of the present invention to provide a magnetron sputtering device that will allow for longer target life.

It is an object of the present invention to provide a magnetron sputtering device that will allow for uniform target erosion.

It is an object of the present invention to provide a magnetron sputtering device that will yield more consistent performance in sputtering plasma deposition processes.

It is another object of the invention to provide a magnetron sputtering device that creates more complete target erosion and significantly greater target usage, to reduce the incidence of replacement.

It is a further object of the invention to provide a magnetron sputtering device that employs a dynamic magnet array.

It is another object of the invention to provide a magnetron sputtering device that creates more complete target erosion through a sweeping linear magnetic array.

It is still another object of the invention to provide a magnetron sputtering device that creates more complete target erosion through a sweeping linear magnetic array coupled with edge shunts.

It is an object of the invention to provide a magnetron sputtering device that would broaden the race-track erosion pattern of the prior art systems.

It is a further object of the invention to provide a magnetron sputtering device that would compensate for the end edge erosion of the prior art devices.

It is another object of the invention to provide a magnetron sputtering device that incorporates shunt patches to evenly distribute target erosion over the end edges of a target.

It is an object of the invention to provide a magnetron sputtering device that moves linearly in a plane, or planes, on, or along, axes of the target.

SUMMARY OF THE INVENTION

The present invention is directed to a sputtering device such as a magnetron assembly that will provide for more nearly complete, to complete, uniform target erosion than heretofore has been achieved by prior art systems. In one embodiment of the present invention the magnetron can be in the form of a linear assembly. The linear magnetron may consist of a generally rectangular magnet pack. The magnet pack can be a relatively small, three-dimensional rectangular unit. While cast hollow, the magnet pack may be filled with smaller magnets. The magnet orientation, shape, and size may be varied in conjunction with the size and shape of the pack.

The magnet pack may be placed in a casing. The casing should be large enough so that the magnet pack will be able to move in a plane completely over the target backing. A frequency actuator or motor may generate the sweeping motion of the magnet pack. However, it is preferable that the range of motion be limited in both directions off a central axis to limit or reduce the risk of secondary plasmas in the target shield area. Also, the movement can be in two planes: front-to-back (across the width), or side-to-side (across the length). The movement may be determined by the size and shape of the target. Additionally, the actuator may allow for vertical plane movement of the magnet pack within the casing. However, it is preferable that the movement be restricted to that in a horizontal plane. Movement in a vertical plane may create plasma gaps, which could lead to non-uniform target erosion patterns.

The horizontal sweep by the magnet pack over the target backing will provide more uniform target erosion overall. While, the instantaneous position of the magnet pack will focus collisions on that respective part of the target material, the constant sweeping will spread the collisions in a shaving pattern, such as slicing. In addition, the casing may contain short edge shunts to minimize the erosion change across the target surface. The short edge shunts are preferably placed at each end of the rectangular casing.

The present invention also includes in the sputtering system described, means to scan substrates past the moving magnetron cathode at a range of speeds. The magnetron array can be moved at frequencies up to about 70 rpm, which translates into a maximum speed of about 700 cm/min. A batch pallet holding the substrates in the sputtering tool can be scanned at speeds ranging from about 1 cm/min to about 800 cm/min.

BRIEF DESCRIPTION OF THE DRAWINGS

FIG. 6A shows the lengthwise cross-sectional view of the target erosion profile for a prior art magnet pack. FIG. 6B shows the comparative lengthwise cross-sectional target erosion profile for the present embodiment of the sweeping linear magnetron cathode.

REFERENCE NUMERAL DESIGNATIONS

100 Linear Magnetron
1 Magnet Pack
1A Orifices
1B Outside Surface
1C Cut-Out

2 Cathode Backing Plate
3 Drive Housing
4 Water Manifold Mounting Bracket
5 Water Manifold Mounting Bracket
6 Motor
6A Energy Supply
6B Motor Shaft
7 Motor Insulator
8 Ground Clip
9 Ground Strap
10 Bearing Support Plate
11 Linear Block Bearings
11A Linear Block Bearings
12 Dark Space Shield
13 Target
14 Fluid Passage
15 Intake Manifold
15A Pipe
16 Outlet Manifold
16A Pipe
17 Eccentric Drive Shaft
18 Eccentric Drive Plate
19 Yoke
20 Bearing Mounting Bracket
21 Air Cylinder
22 Air Cylinder Mounting Bracket
23 Pneumatic Valve
24 Magnet Mounting Plate
25 Target Erosion Profile
26 Stroke Sensor
27 Flow Controls
28 Timing Belt
29 Chamber Top Plate
30 Enclosure
31 Cathode Insulator
32 Cooling Fins
33 Pump
34 Vacuum Chamber
35 Magnetron Assembly
36 Substrate Carrier
37 Throttle Valve
38 Controller
39 Process Gas
40 Plasma
41 Target Mounting Surface
42 End Magnets
43 Pulley
44 Mounting Surface on Cathode Backing Plate
45 Erosion Linear Region
46 Erosion End Region
47 Screw
48 Insulator
49 Washer
50 Insulator Bushing
51 Screw
51A Washer
52 Drive Pulley
53 Duplex Bearing
54 Bearing Clamp
55 Bearing Lock
56 Eccentric
57 Eccentric Shaft
58 Radial Bearing
59 Bearing Rail Mount
59A Bearing Rail Mount
60 End Surface of Magnet Pack
61 Bearing Rail Mount
62 Bearing Rail Mount
63 Linear Rail Bearing
64 Linear Rail Bearing
65 Bearing Block Mount
66 Bearing Block Mount
67 Air Gap
69 Side Magnets
70 Center Line
71 Center Magnets
72 Filler Magnets
73 End of Magnet Pack
74 Base Edge of Magnet Mounting Plate
75 Base Edge of Magnet Mounting Plate
76 Side Edge of Magnet Mounting Plate
77 Side Edge of Magnet Mounting Plate
78 Diagonal Edge of Magnet Mounting Plate
79 Diagonal Edge of Magnet Mounting Plate
80 Diagonal Edge of Magnet Mounting Plate
81 Diagonal Edge of Magnet Mounting Plate

DETAILED DESCRIPTION OF THE INVENTION

Figure 1:
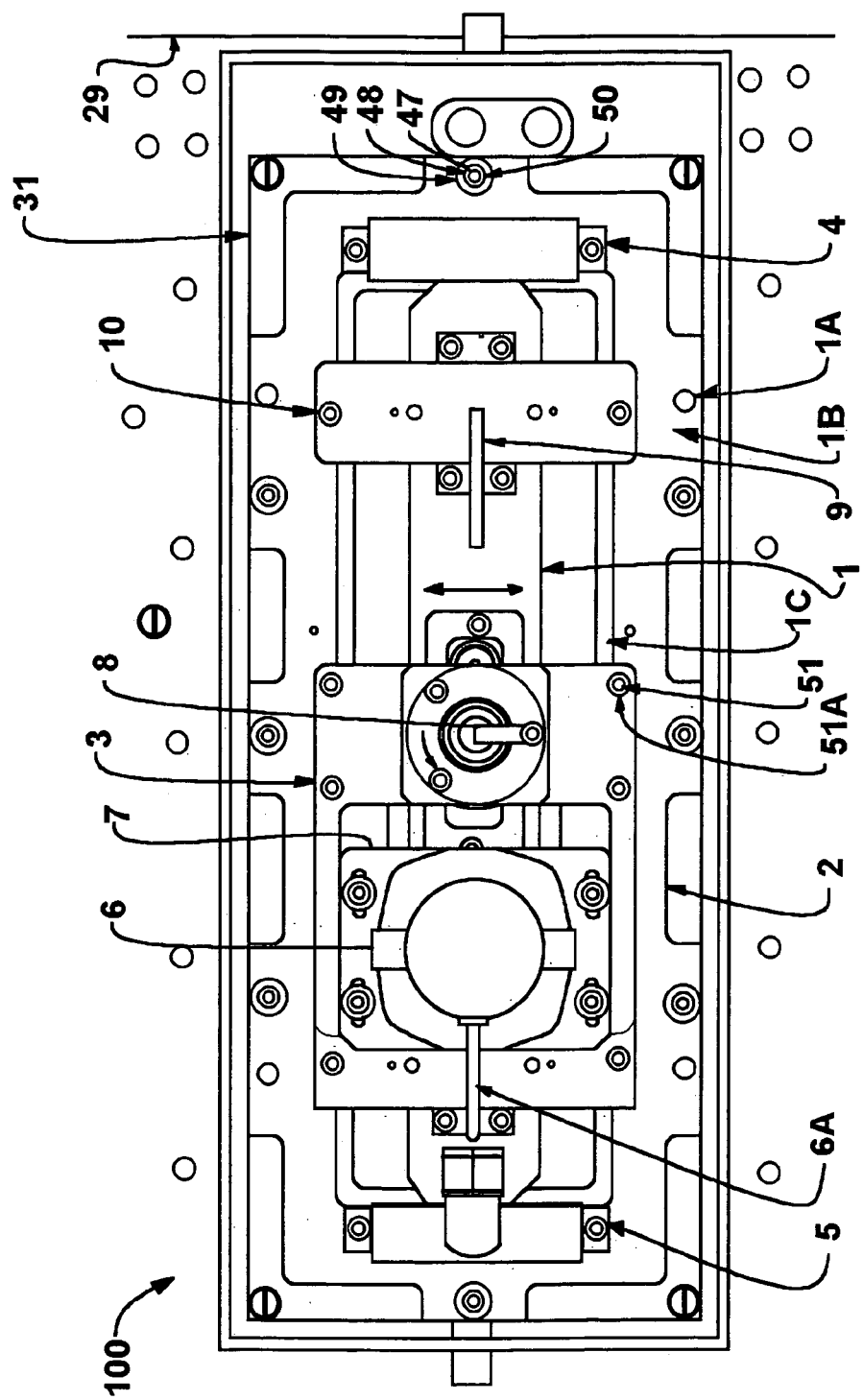
FIG. 1 is a top view of a sweeping linear magnetron cathode according to the present invention.

One embodiment of the present invention, an improved linear magnetron assembly for uniform target erosion, is depicted in FIG. 1. The linear magnetron 100 includes a cathode backing plate 2. The cathode backing plate 2 may be in the form of a copper plate, or manufactured from another suitable substance with similar electrical and thermal conductivity characteristics. Preferably, the cathode backing plate 2 may have terminals (not shown) for receiving an electric current. The linear magnetron assembly 100 should be adapted to be attached to a chamber top plate 29, which can be the top surface of a vacuum chamber 34 wherein the plasma deposition process will occur.

The cathode backing plate 2 may have a plurality of orifices 1A for receiving a bolt or other securing means positioned at various locations around the perimeter. These orifices around the cathode backing plate 2 are for securing the cathode backing plate 2 to a cathode insulator 31. Alternatively, the cathode backing plate 2 may be otherwise secured to the cathode insulator 31. Preferably, the cathode insulator 31 is attached to the top of the vacuum chamber by a screw 47, insulator 48, and washer 49 assembly. The insulator may be coupled with an insulator bushing 50 to effectively seal the cathode backing plate 2 to the cathode insulator 31, which provides electrical insulation.

On the outside surface 1B of the cathode backing plate 2 a drive housing may be positioned over a cut-out. The cut-out preferably has a generally rectangular configuration to allow for sweeping of the linear magnetron in a horizontal plane within the cut-out. The drive housing is preferably immovably attached to outside surface 1B by a screw 51 and washer 51A. The drive housing 3 can hold a motor 6. The motor 6 should have an energy supply. A motor insulator is preferably attached to the motor for electrical isolation. In another embodiment, the motor may be replaced with a frequency actuator or other device that converts electronic commands into mechanical operations. As seen more clearly in FIG. 10, motor 6 can connect to a controller 38. The controller 38 may be programmed to maintain linear velocity of the magnet pack across the width and/or length of the target. Referring again to FIG. 1, ground clip 8 can maintain the eccentric drive shaft 17 and magnet pack 1 at equal voltage potentials. Ground strap 9 attached to bearing support plate 10 and magnet pack 1 maintains the magnet pack and cathode backing plate 2 at equal voltage potentials. This eliminates current flow in any of the above components and, in turn, eliminates heating of the magnet pack. It is important not to generate heat in the magnet pack as the magnet strength degrades with an increase temperature.

Figure 3:
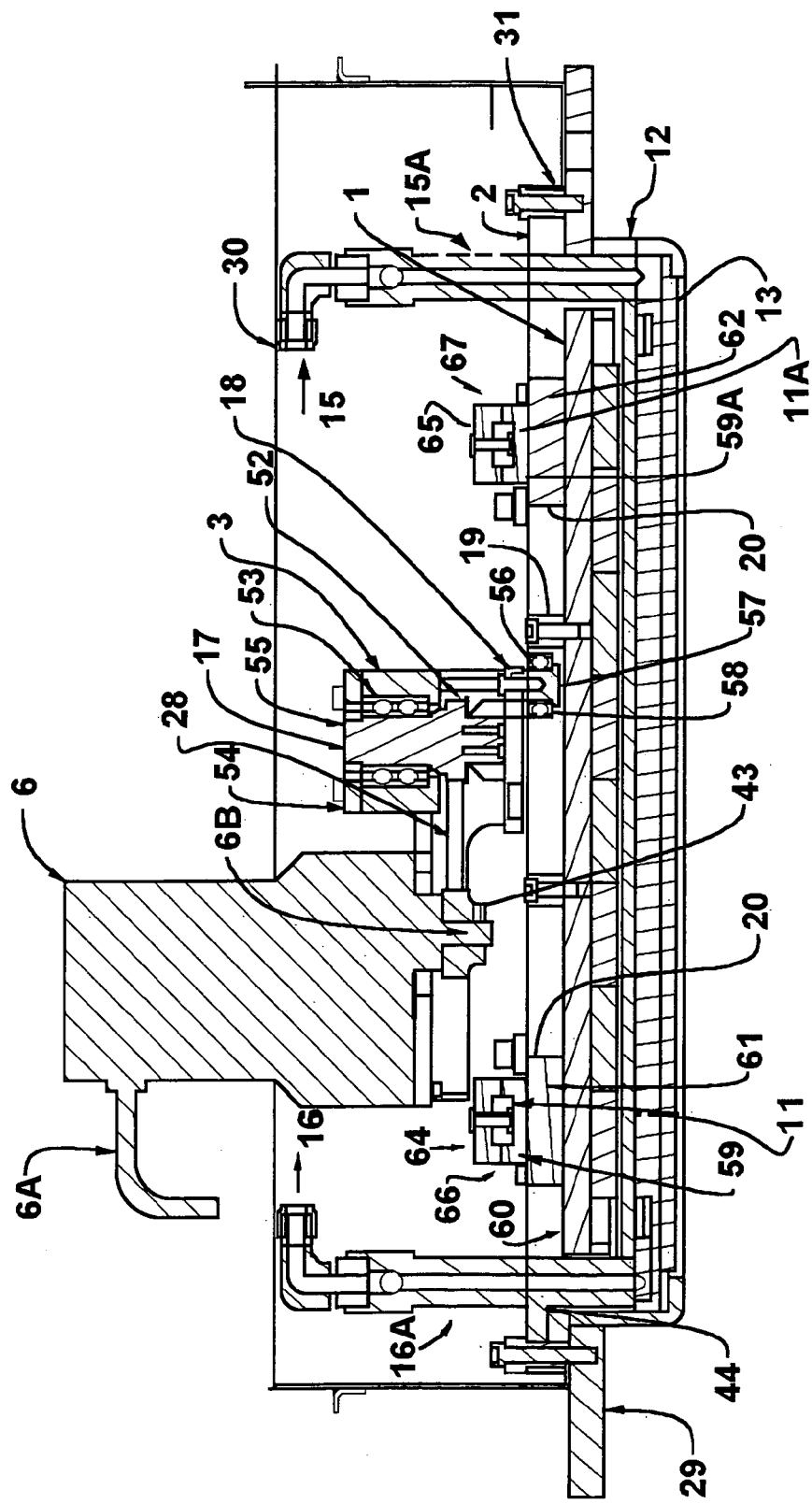
FIG. 3 is a longitudinal, cross-sectional view of the sweeping linear magnetron cathode shown in FIGS. 1 and 2.

As seen in FIG. 3, in a preferred embodiment of the invention, when the motor 6 is activated, the motor shaft 6B turns a pulley 43. As the pulley 43 rotates, it turns a drive pulley 52 by means of a belt such as a timing belt 28. The drive pulley 52 can be attached to an eccentric drive shaft 17. The eccentric drive shaft 17 can be housed in a duplex bearing 53, which, in turn, is attached to the drive housing 3 by bearing clamp 54. Eccentric drive shaft 17 can have a varied rotation speed, but is preferably in the range of about 1 to 68 revolutions per minute (rpm). This rate can translate to a linear travel speed of the magnet pack 1 from about 10 cm/min to about 700 cm/min. On the uppermost portion of the eccentric drive shaft 17 can be a bearing lock 55. The duplex bearing 53 facilitates linear motion of the magnetron. The bearing lock 55, which may be a nut, allows the magnetron to move only a fixed distance off axis, in either direction.

The end of eccentric drive shaft 17 opposite the duplex bearing 53 can be fixed to an eccentric 56 housed in an eccentric drive plate 18. As the eccentric drive shaft 17 rotates, the eccentric 56 rotates. The eccentric 56 has a shaft 57, which is fixed to it. The free end of the shaft 57 is housed in a radial bearing 58. A reciprocating motion results when the shaft 57 rotates around the axis of the eccentric 56. The radial bearing 58 facilitates this reciprocating motion. The radial bearing 58 is immovably attached to a yoke 19. The yoke 19, in turn, is immovably attached to a magnet pack 1. Thus, upon activation of the motor 6, the magnet pack will be moved in a reciprocating motion back-and-forth, sweeping over the target 13. The linear sweeping motion of the magnet pack 1 will provide a more uniform erosion of the target 13. Specifically, the movement of the entire magnet pack will focus ionized gas atoms at the end edges of the target 13, effectively reducing the race-track erosion effect found in the prior art.

While reciprocating movement may tend to produce non-linear travel, the magnet pack 1 is preferably restricted to linear movement. Attached to the cathode backing plate 2, stretching over cut-out 1C are bearing rail mounts 59 and 59A. The bearing rail mounts 59 may be immovably fixed to the cathode backing plate 2. Attached to the end surface 60 of the magnet pack 1 are bearing rail mounts 61 and 62. On top of bearing rail mounts 61 and 62 are linear block bearings 11 and 11A, respectively. The linear block bearings 11 and 11A are immovably fixed to the bearing rail mounts 61 and 62, respectively. Linear rail bearings 63 and 64 are immovably fixed to bearing block mounts 65 and 66, respectively. The linear rail bearings fit within the linear block bearings, providing a linear, relatively frictionless motion for the magnet pack.

Additionally FIG. 3 shows the method of attachment of the present invention to a vacuum chamber. A mounting surface 44 on the cathode backing plate 2 can be the contact point for mounting the present device on a vacuum chamber 34. Mounting surface 44 can sit on an insulator 31, which can electrically isolate the present device from the vacuum chamber 34. When the vacuum chamber 34 is evacuated, the space above mounting surface 44 is preferably at atmospheric conditions, while the space below, the chamber, is at vacuum conditions.

Figure 2:
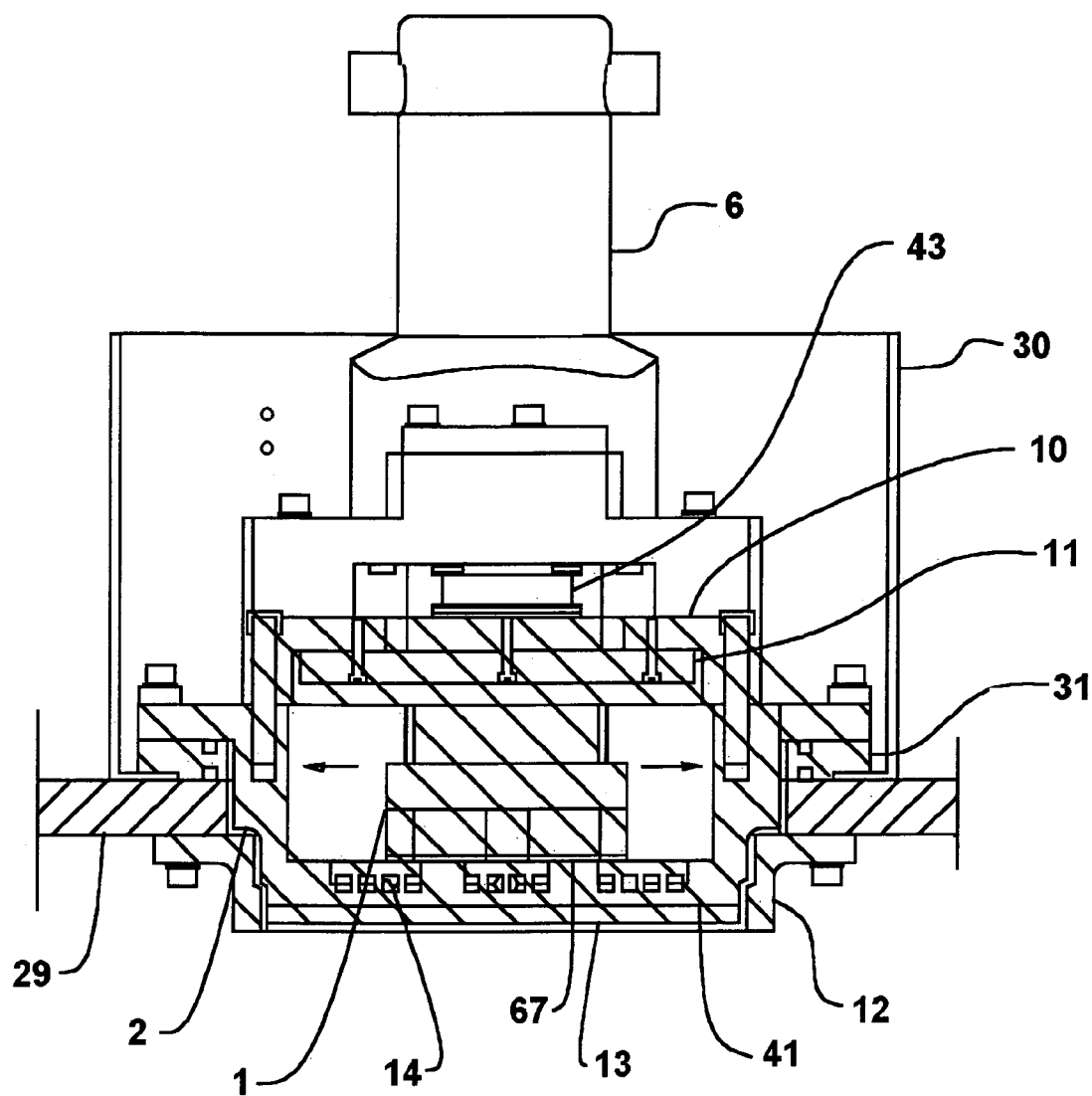
FIG. 2 is a transverse, cross-sectional view of the sweeping linear magnetron cathode shown in FIG. 1.

As seen in FIG. 2, directly beneath the magnet pack 1 is an air gap 67. The air gap 67 between the magnet pack 1 and the bottom of the cathode backing plate 2 allows for generally frictionless movement. Beneath the bottom of the cathode backing plate 2 can be a fluid passage 14. The fluid passage 14 allows for the passage of a cooling liquid, preferably water, from an intake manifold 15 to an outlet manifold 16 which are equipped with shut-off valves. Manifolds 15 and 16 are attached to water pipes 15A and 16A, respectively. The circulation of water is used to keep the target material cool. A flow of cooling liquid across a surface of the target material and cathode backing plate can remove heat generated during the sputtering process. Fluid passage 14 is preferably engineered to maintain a turbulent flow of cooling liquid. Increased temperature around the target material may cause unpredictable changes in the properties of the plasma as well as an increased number of ion collisions with the target. These increased collisions may be detrimental if the coating requires a semi-controlled plasma environment. Also seen in FIG. 2 is a dark space shield 12. Dark space shield 12 surrounds cathode backing plate 2 and is used to avoid the generation of unwanted plasma at the sides of the target area by maintaining the integrity of the magnetic field.

Beneath fluid passage 14 may be the target material 13, or a target mounting surface 41 with the target material 13 on its bottom surface. Target material 13 may be a non-magnetic metal, magnetic metal, boron- or phosphorus-doped silicon or other semiconductor, or transparent conductive oxide to be deposited reactively or non-reactively on a substrate. Target material 13 can be fastened to cathode backing plate 2 with known soldering techniques or bolted using an appropriate heat transfer medium placed between the target and the backing plate.

Figure 4A:
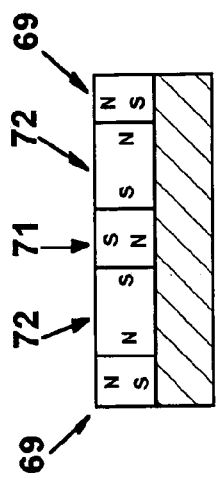
FIGS. 4A, 4B, and 4C show the end, top and cross-sectional views, respectively, of representative magnetron packs used in the present invention.
Figure 4B:
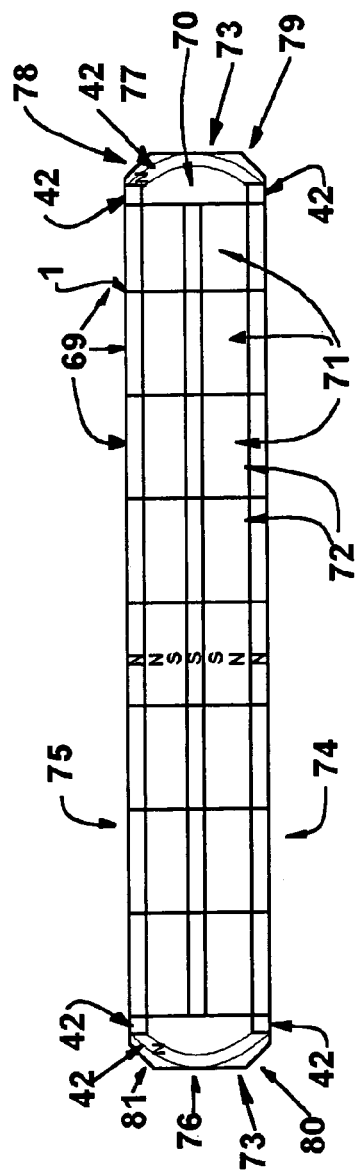
Figure 4C:

FIGS. 4A, 4B and 4C present a more detailed view of the magnet pack 1 of the present invention. In the prior art magnet packs magnets may be present on only a portion of the pack. In the present invention, the magnet pack 1 can have a magnet mounting plate 24 and a second magnet mounting plate (not shown) similar in shape to the magnet mounting plate that goes over the magnet mounting plate and the magnets contained therein thereby forming generally a sandwich effect. Preferably, the magnet mounting plate 24, and second magnet mounting plate are non-ferrous. Magnet mounting plate 24 can be provided with cooling fins 32. Cooling fins 32, along with ground clip 8 and ground strap 9 can maintain the magnet pack 1 temperature below 80 degrees Fahrenheit during the sputtering process.

In FIG. 4B, the second magnet mounting plate has been removed for ease of viewing. The magnet mounting plates may be oriented in a parallel manner that will form a casing with magnets bonding them together. As seen in FIG. 4B, there is lining the edges of the magnet mounting plate 24 are side magnets 69. Along the center line 70 of the magnet mounting plate 24 are center magnets 71. Between the center magnets 71 and side magnets 69 can be filler magnets 72. The filler magnets 72 can be used to provide continuity and control to the magnetic field generated by the other positioned magnets.

The center magnets 71, the side magnets 69 and the filler magnets 72 can cover a portion of the surface of the magnet mounting plate 24. In order to improve the sputtering and reduce the non-uniform erosion, it has been found that even more magnets are desirable. A plurality of individual magnets can be bonded to one of the magnet mounting plates in an arrangement such that as much of the surface of the magnet mounting plate as possible has been provided with a magnet for at least a portion of the time during operation. Alternatively, solid, larger magnets may be used that will perform the same function as the plurality of individual magnets. End magnets 42 may be used at the ends 73 of the magnet pack 1. The end magnets 42 may be preferably positioned in an arrangement that is similar to an arc on ends 73 of the magnet pack 1. Alternatively, the end magnets 42 can be arranged in a squared manner along the edge of the magnet mounting plate 24. The end magnets 42 will act as a shunt for the magnetic flux.

As seen in FIGS. 4A, 4B and 4C there is a representative example of a magnet mounting plate 24 that has a first base edge 74 and a second base edge 75. These edges may be parallel to each other if desired. The base edges 74 and 75 may be connected by generally perpendicular side edges 76 and 77. In one embodiment as seen in FIG. 4B, the side edges have one or more diagonal edges 78, 79, 80, and 81. Although the magnet mounting plate has been shown with a particular configuration, it will be appreciated that the magnet mounting plate can be other convenient shapes including but not limited to curved side edges, combinations of curved and straight edges or combinations of curved edges. It will also be appreciated that the arrangement of the magnets will vary depending on the shape of the magnet mounting plate. For the most part there will be center magnets 71, side magnets 69 and the filler magnets 72 that cover a major portion of the surface of the magnet mounting plate as well as one or more end magnets 42 that conform in either shape or layout to most of the remaining area of the magnet mounting plate that covers the portion of the target that is subject to the sputtering. The end magnets reduce the need for the entire working surface of the magnet mounting plates to be covered with magnets. Although, if desired, the regions that do not have any magnets attached may also be provided with filler magnets was well. Thus, when the magnet pack 1 sweeps over the target material, the end magnets provide a means to effect erosion on the end edges of the target and eliminate the race track erosion seen in the prior art devices. Without the end magnets, the target may erode in its center, but not along its edges. This non-uniform erosion of the prior art is deleterious to the overall sputtering process and increase the risk that costly targets may have to be replaced more often.

As seen in FIG. 4A, the polar orientation of the end magnets 42, side magnets 69, center magnets 71 and filler magnets 72 should be such that will provide a relatively uniform magnetic field, thereby increasing frequency of contact between ionized gas atoms and the target material. Preferably, the end magnets 42 will be fixed to the magnet mounting plate 24 with their south poles facing the target. Additionally, in a preferred embodiment, the side magnets 69 will have their north poles face the target; the center magnets 71 will have their south poles face the target. The filler magnets 72 may be oriented such that their north poles contact the side magnets 69, while their south poles contact the center magnets 71. These preferred polar orientations should provide a magnetic field that will increase the amount of plasma ion collisions with the target material thereby increasing the amount of sputtered material. Additionally, the sweeping motion of the magnet pack 1 will move that magnetic field over the entire target, thereby causing the erosion pattern to be uniform.

As seen in FIG. 1, the magnet pack 1 is confined to movement within cut-out 1C. The range of motion of the magnet pack may be maintained to prevent formation of secondary plasma gaps in the target shield area. Secondary plasma gaps contribute to non-uniform erosion. Also, short edge shunts (not shown) may be placed along the end edges of cut-out 1C. Short edge shunts may maintain a constant magnetic field over the problematic end edges of the target area. Thus, the sweeping movement of the magnet pack 1 and positioning of short edge shunts can lead to uniform erosion along the end edges of the target area. Additionally, short edge shunts may be semicircular or any shape that will conform to the cut-out 1C including along the edges of cut-out 1C. Short edge shunts may be placed at both ends of the cut-out 1C.

Figure 5:
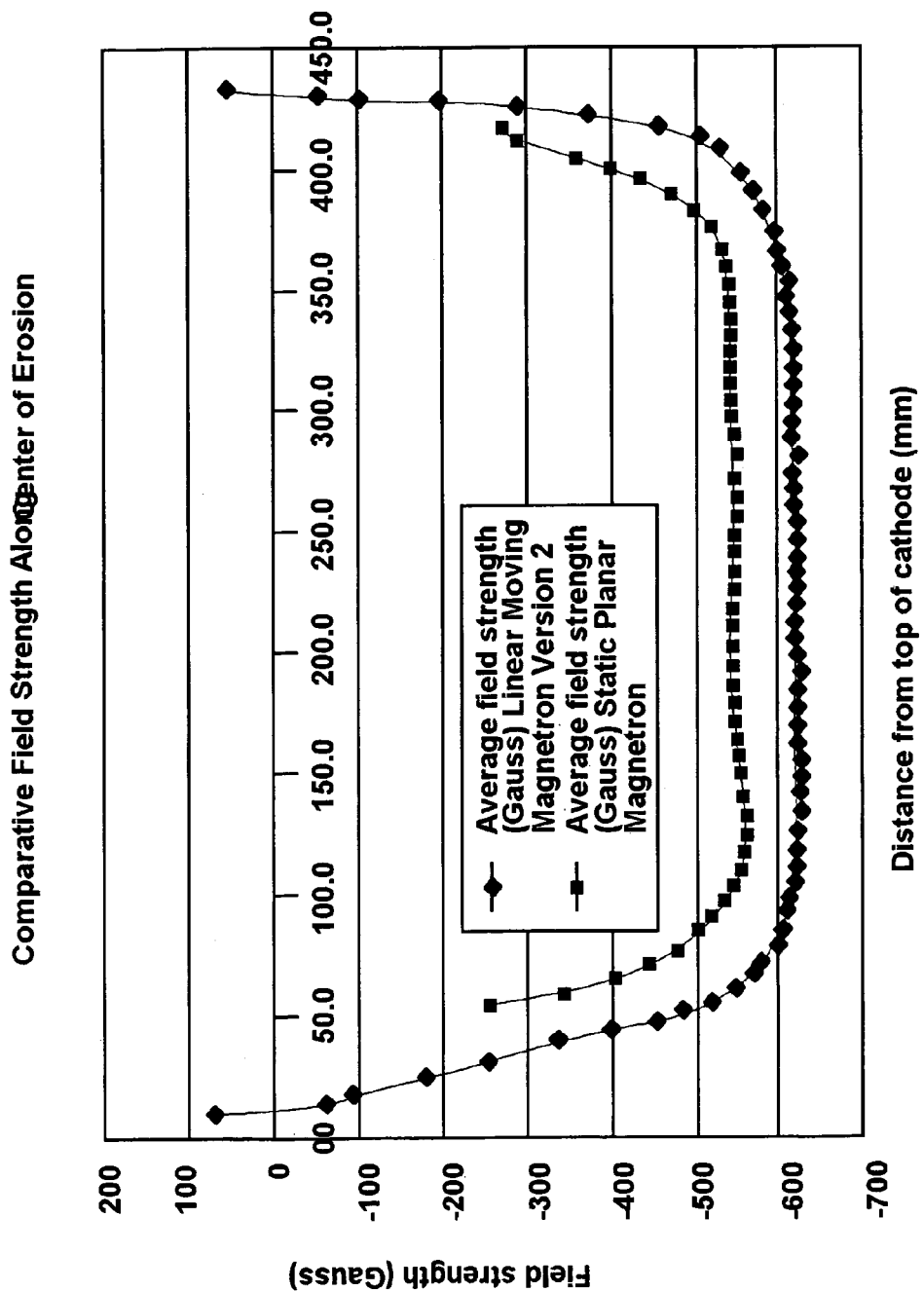
FIG. 5 shows the measured magnetic field at the surface of the target in the center of the erosion zone with the magnet pack shown in FIG. 4A–4C held stationary in its center position. The measured magnetic field of a standard conventional planar cathode is also shown in this plot for comparison.

FIG. 5 shows a plot of the average measured magnetic field in the center of erosion for a static magnetron, as used in the prior art, compared with the average measured magnetic field in the center of erosion for the sweeping linear magnetron of the present invention. In FIG. 5, the present magnetic field was measured with the magnet pack of the present invention held centered and stationary over the target material. The configuration of the magnets within the magnet pack alone provides a greater magnetic field strength than that generated by the prior art magnetrons.

FIG. 6A illustrates a target erosion profile for a magnetron with a static magnet pack as taught by the prior art. The racetrack feature of the prior art is depicted as erosion linear region 45. FIG. 6B illustrates a target erosion profile for the sweeping linear magnetron in accordance with the present invention. FIG. 6B also illustrates the elimination of cusping and broadening of the erosion area on the surface of the target when the sweeping linear magnetron of the present invention is used.

Figure 7A:
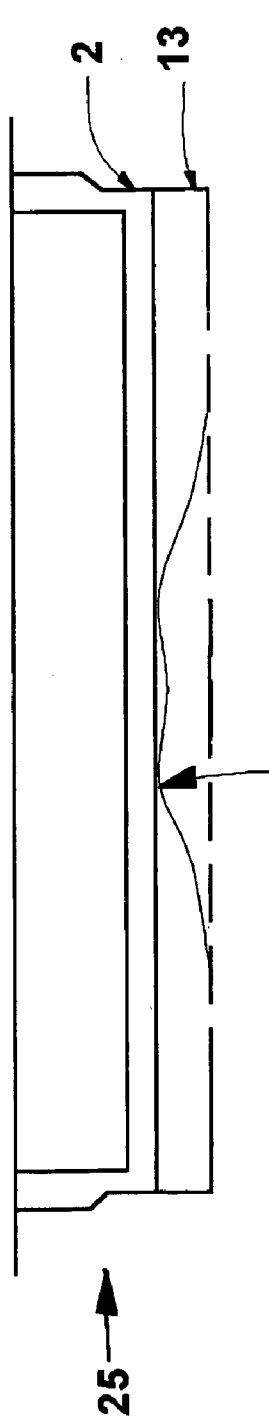
FIG. 7A shows the end view cross-section of the target erosion profile for a prior art magnet pack.
Figure 7B:
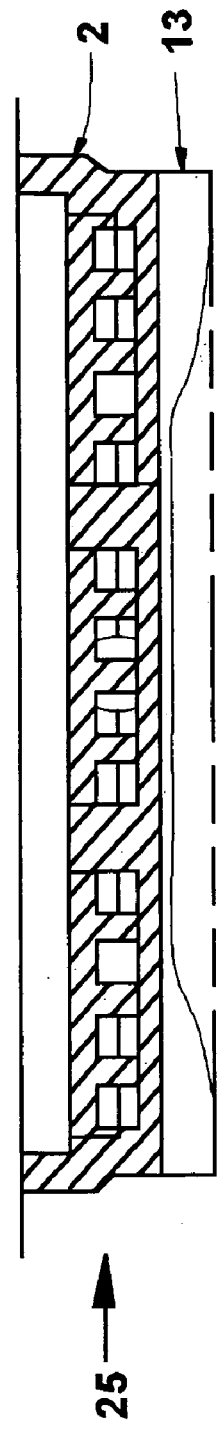
FIG. 7B shows the comparative end view cross-section of the target erosion profile for the present embodiment of the sweeping linear magnetron cathode.

FIG. 7A shows the erosion profile at the end (turn around) of a magnetron using a static magnet pack as taught in the prior art. An erosion end region 46, which is a part of the racetrack pattern problem of the prior art, is shown in FIG. 7A. FIG. 7B shows the erosion profile at the end of a magnetron using the sweeping linear magnetron used in accordance with the present invention. Comparing FIGS. 7A and 7B, it can be seen that the target is eroding at a higher rate at its ends in the static configuration of the prior art. A higher erosion rate will lead inevitably to more frequent target material replacements and higher costs.

Figure 8:
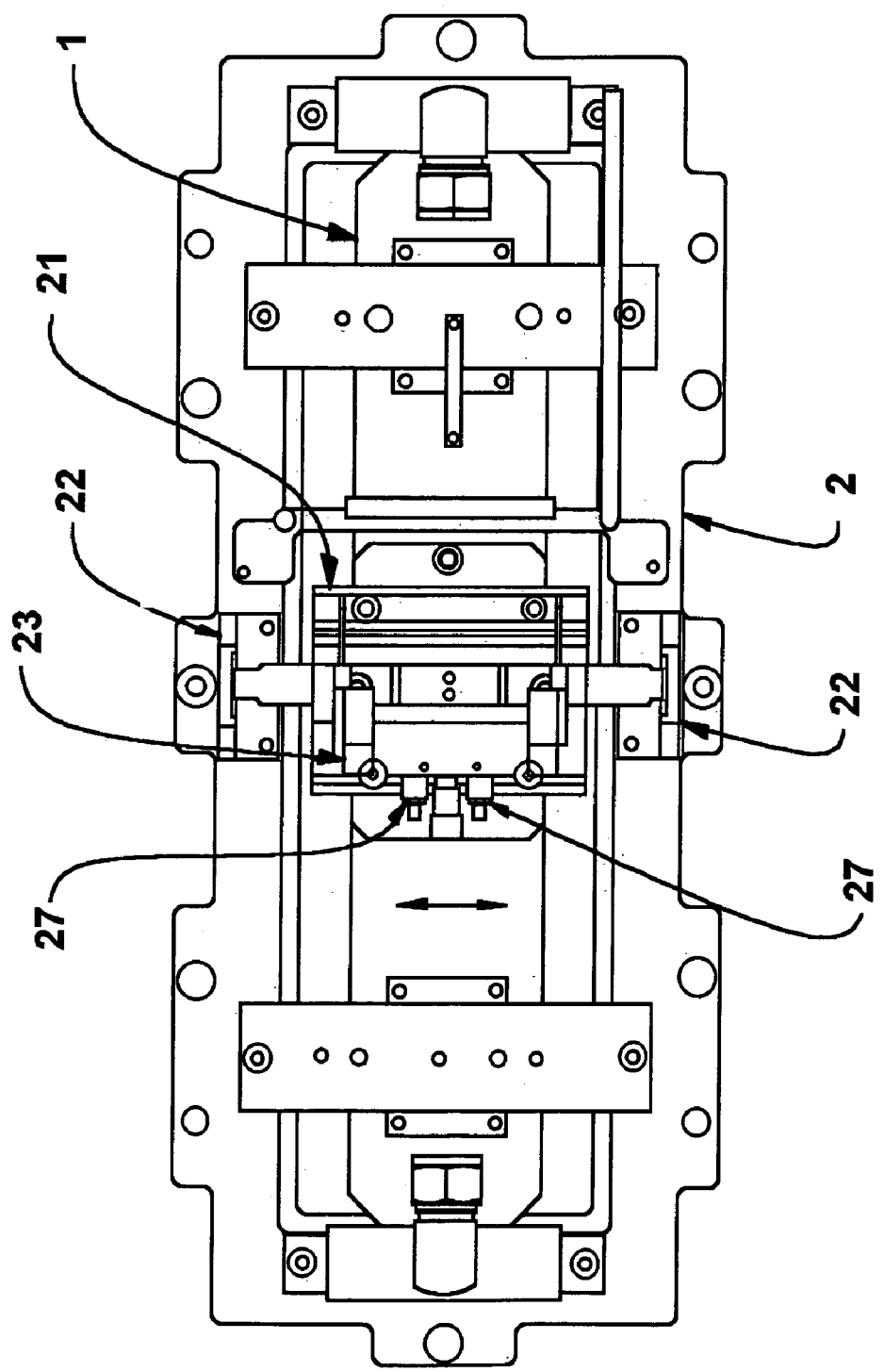
FIG. 8 illustrates a plan view of an alternative embodiment of the magnetron drive mechanism.
Figure 9:
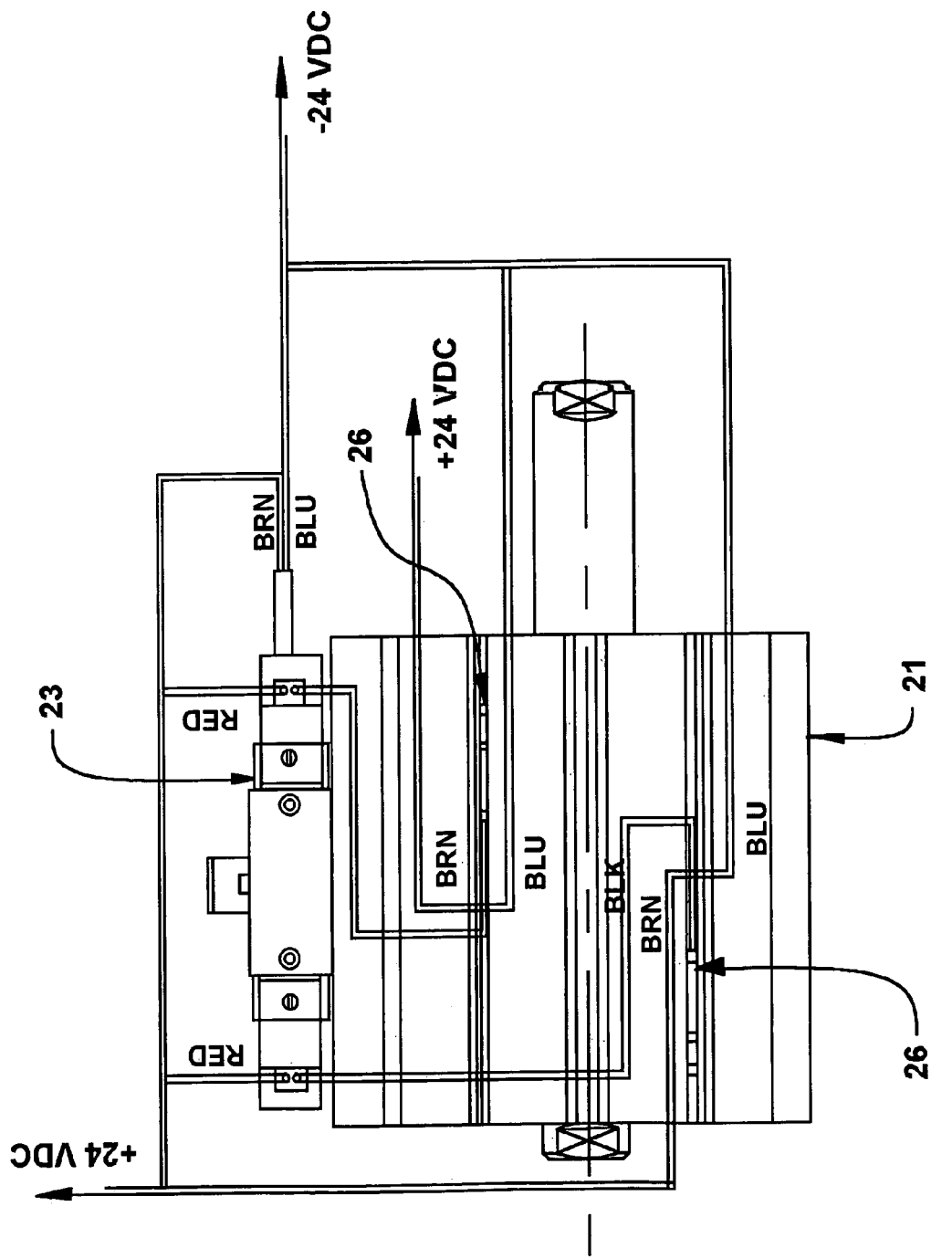
FIG. 9 illustrates a cross-sectional view of the alternative drive mechanism shown in FIG. 8.

Another embodiment of the present invention is illustrated in FIGS. 8 and 9. An air cylinder 21 can replace a motor and be used to generate the reciprocating motion required to drive the magnet pack 1 across the width and/or length of the target. Air cylinder 21 can be mounted to magnet pack 1 and mounting brackets 22. Pneumatic valve 23 can be mounted directly to the air cylinder 21 and used to move the magnet pack 1 linearly. Pneumatic valve 23 can be interchangeable with a solenoid. As seen in FIG. 9, a stroke sensor 26 can cause pneumatic valve 23 to shift, reversing the direction of the magnet pack 1. The linear speed of the magnet can be adjusted using flow controls 27.

Figure 10:
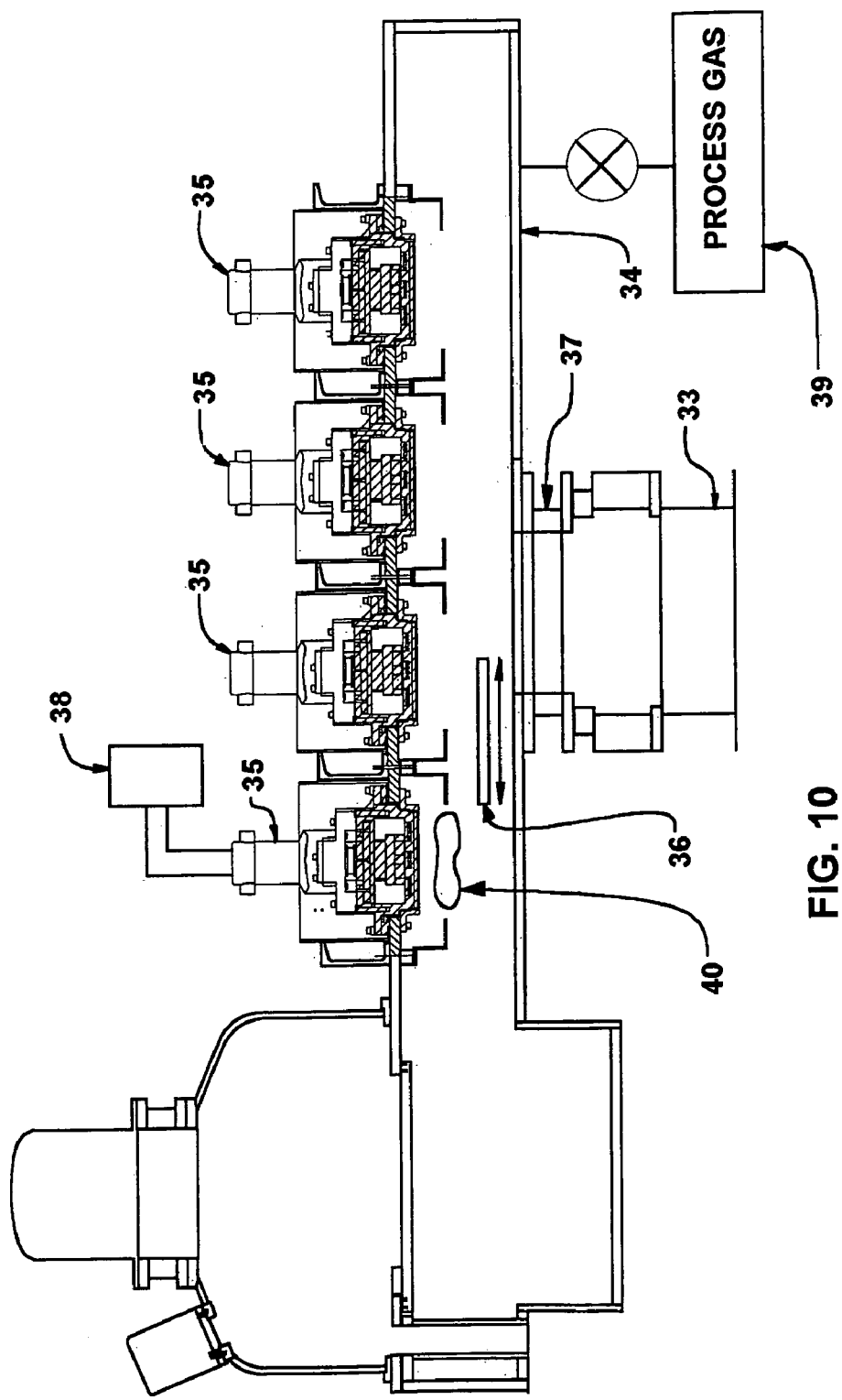
FIG. 10 illustrates the batch sputtering tool of the present invention.

FIG. 10 illustrates a magnetron assembly in a batch deposition tool. In this embodiment, a plurality of magnetron assemblies 35 is positioned in series in a vacuum chamber 34. A substrate carrier 36 can carry a substrate through the vacuum chamber 34 and through the plasma.

Figure 11:
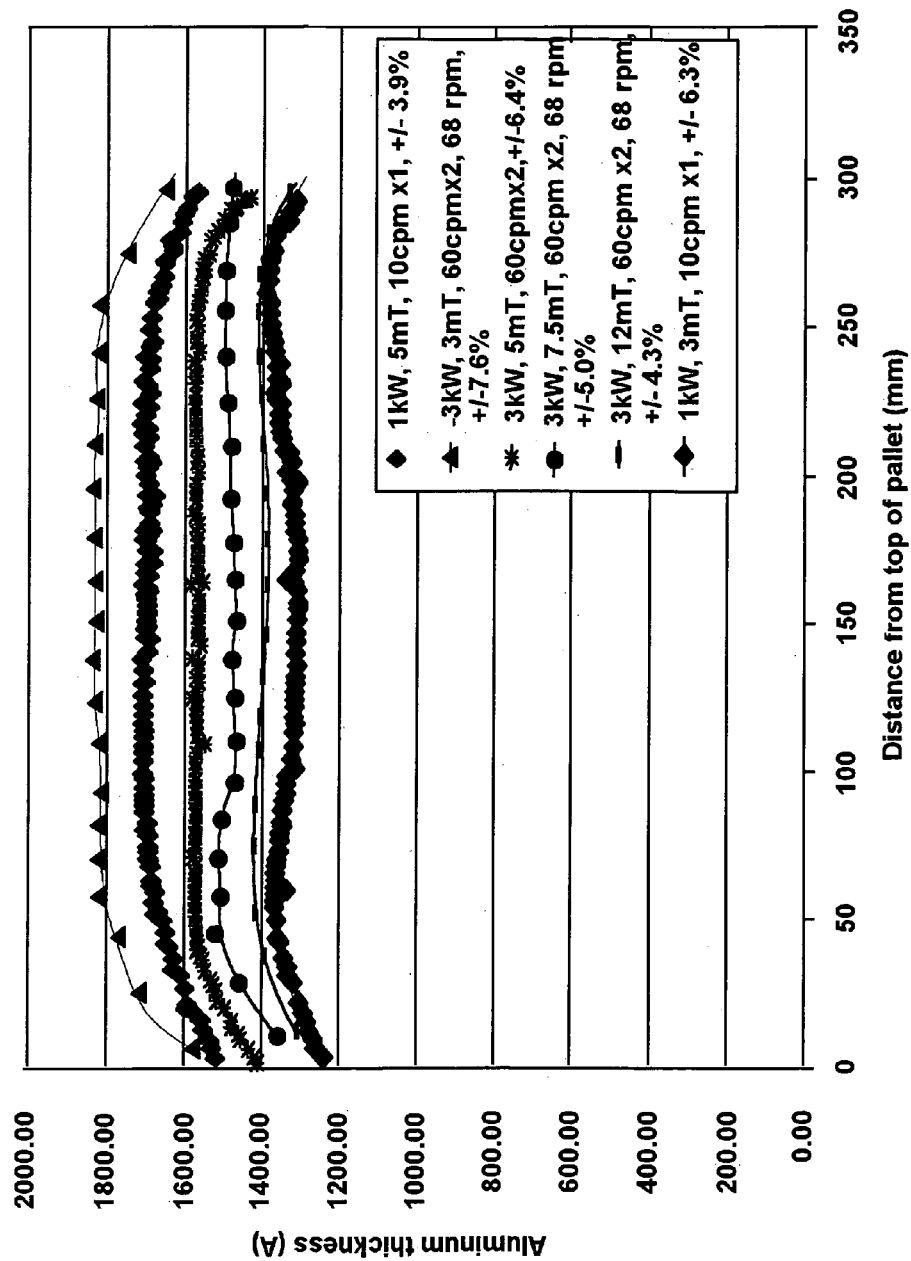
FIG. 11 shows representative film uniformity profiles over a 12"×12" area for aluminum sputtered using the sweeping linear magnetron cathode.

FIG. 11 plots uniformity profiles for aluminum sputtered with the sweeping linear magnetron cathode of the present invention under a variety of process conditions. Film uniformity over a 12"×12" area is in the range of about +/−3–5%, heretofore achieved only by the use of uniformity shapers or a complex planetary motion of the wafers. Furthermore, this uniformity and rate will remain constant through life because of the full erosion of the target face.

Figure 12:
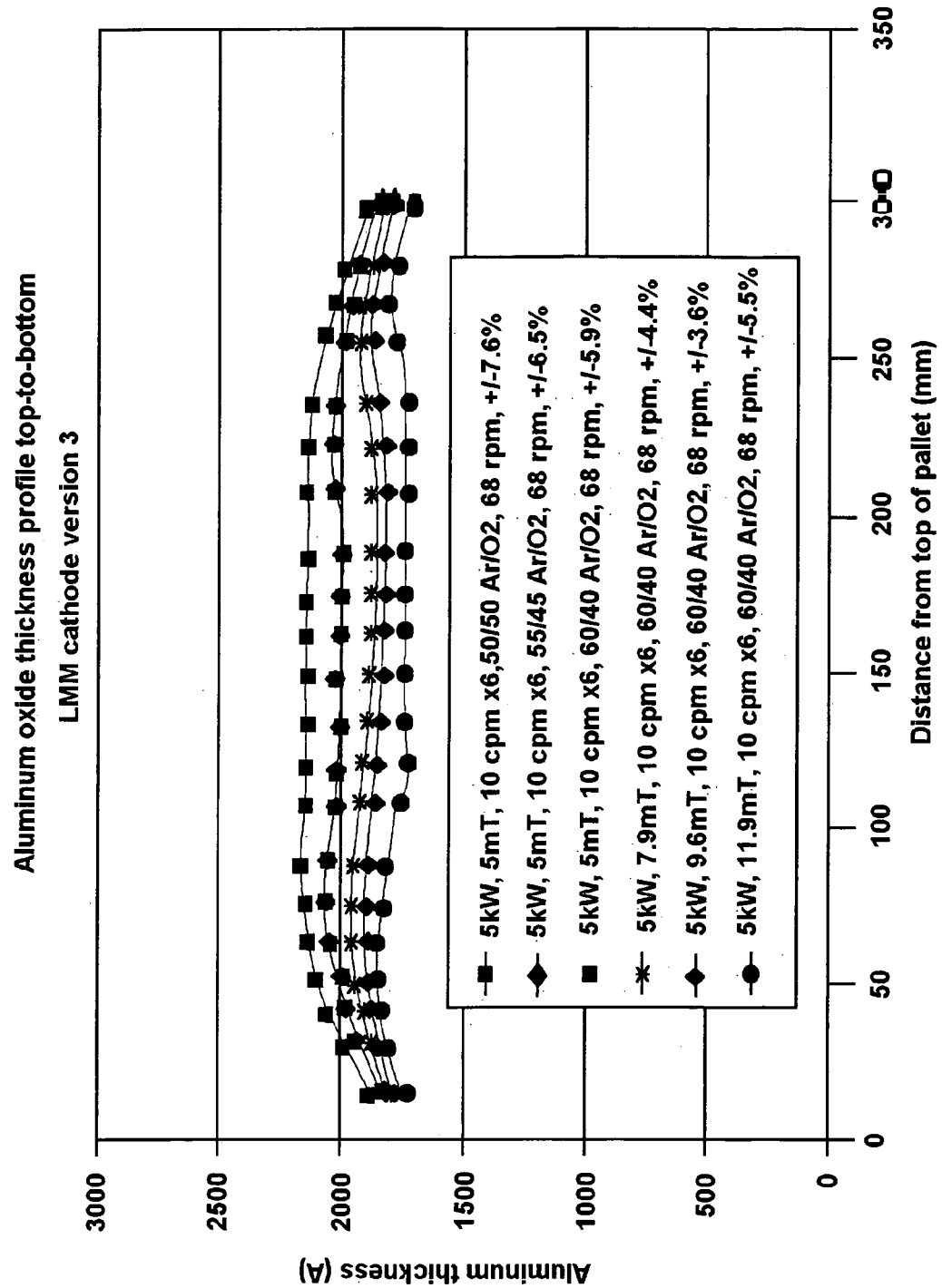
FIG. 12 shows representative film uniformity profiles over a 12"×12" area for aluminum oxide sputtered using the sweeping linear magnetron cathode.

FIG. 12 plots uniformity profiles for aluminum oxide sputtered DC reactively with oxygen and argon from an aluminum target using the sweeping linear moving magnetron cathode under a variety of process conditions. The absence of target poisoning due to the nearly full-face target erosion leads to arc-free deposition of a wide range of dielectric films from elemental targets. It is not necessary to use complex and expensive arc-suppression schemes such as the Advanced Energy® Pinnacle® Plus power supply when using the sweeping linear magnetron cathode of the present invention for reactive sputtering, as compared with a static planar magnetron cathode of the prior art. The uniformity of these reactively-deposited films is also excellent compared to those that are RF sputtered from compound targets, less than about +/−5% as compared with over 10%, typically.

Figure 13:
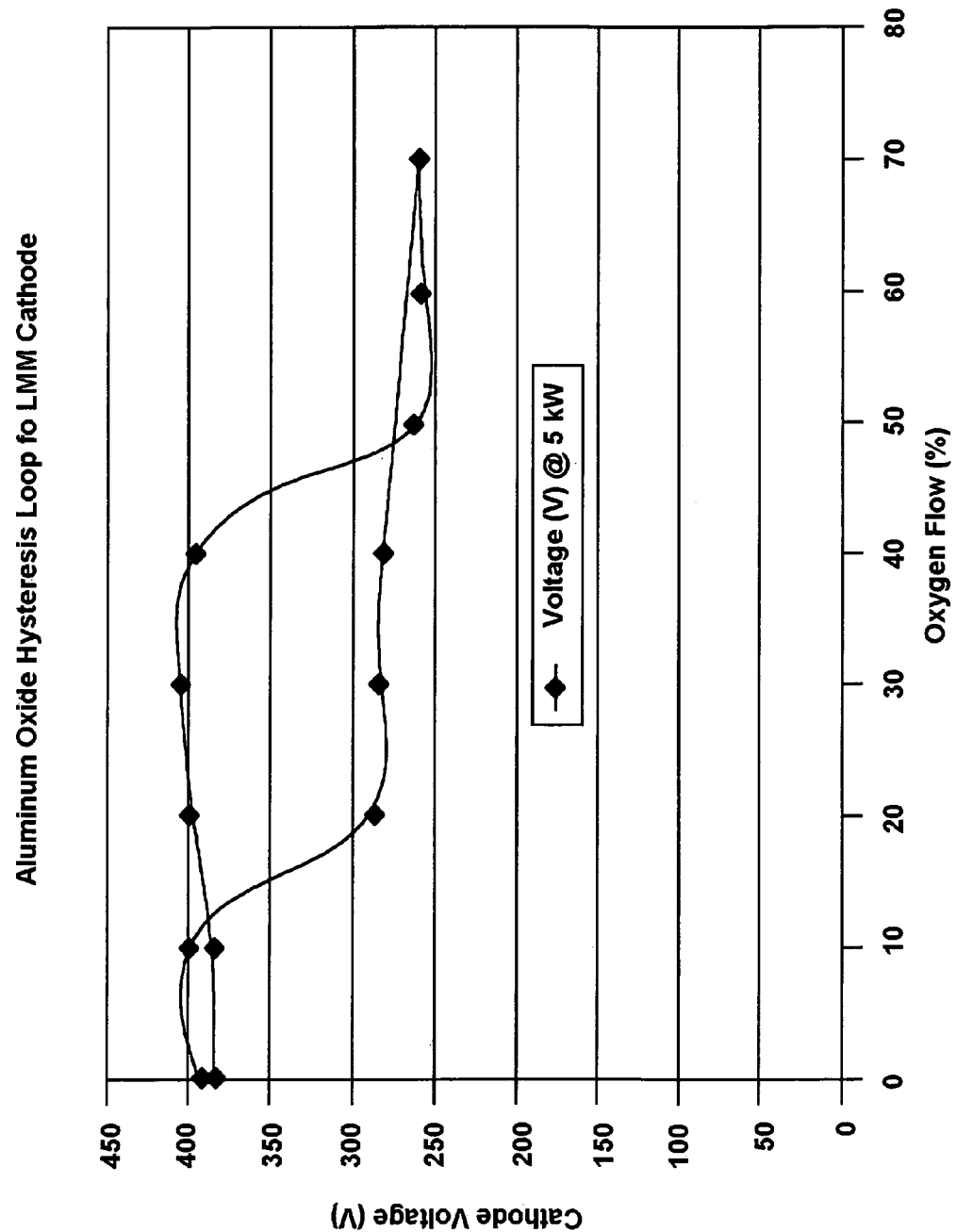
FIG. 13 shows a typical hysteresis loop for aluminum oxide sputtered with the sweeping linear magnetron cathode.

Films can be sputtered at about 5–10 times higher rates than RF-sputtered films from dielectric targets because of the wider power range available for DC supplies, as well as the ability of metallic targets to withstand higher power densities than dielectric targets. So-called "metal-rate processes" which utilize the high rate window of the process hysteresis loop shown in FIG. 13 boost the deposition rates even higher.

An additional benefit of DC reactive processing is that the step coverage achieved is significantly improved over a non-reactive deposition, from about 30% to over 60%. This is due to the fact that the film formation is not determined solely due to the geometrical configuration, but also derives from local reaction at the substrate surface, which lends it more conformality than conventional RF sputtering, somewhat similar to that in chemical vapor deposition. Geometrical factors in the target placement relative to the substrate primarily determine step coverage in standard sputtering, resulting in typically poor step coverage of 30% or less unless heat and/or ion bombardment (bias sputtering) is used to reshape the contours. In DC reactive sputtering, as that contemplated by the present invention, there is an intrinsic conformality in the film formation, resulting in step coverage of about 60%.

Figure 14A:
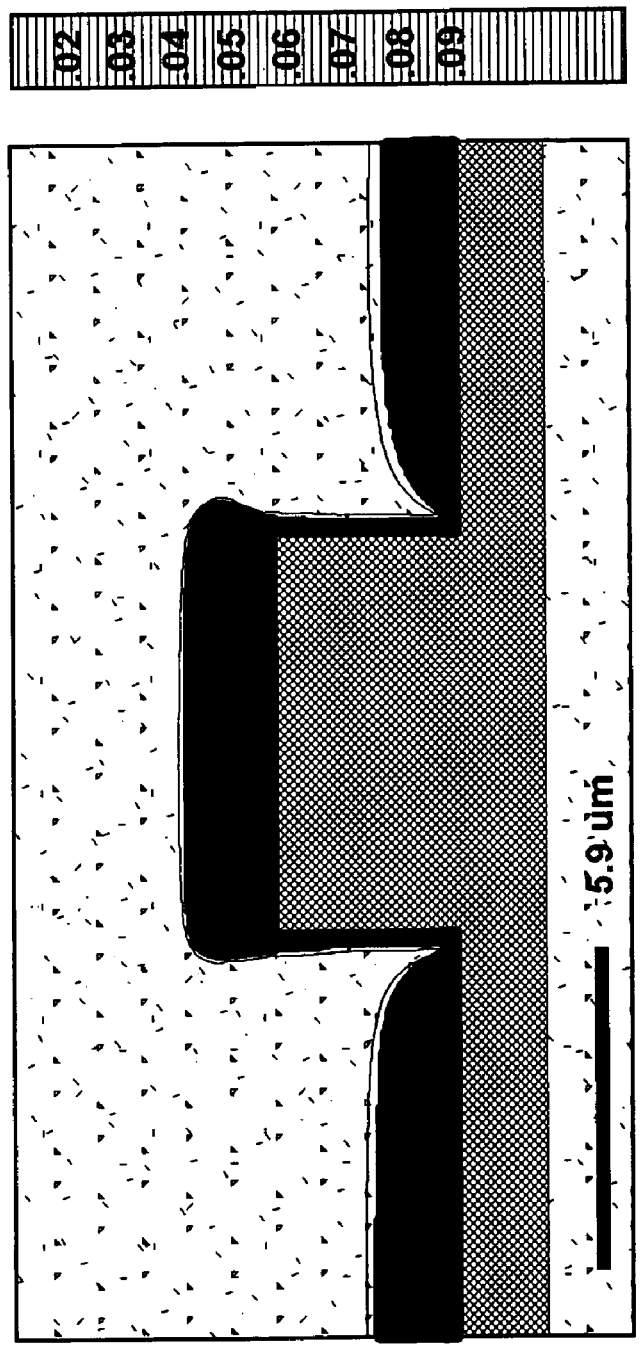
FIG. 14A shows a simulated step coverage profile of RF magnetron sputtered SiO2, with a poor step coverage of less than 30%.
Figure 14B:
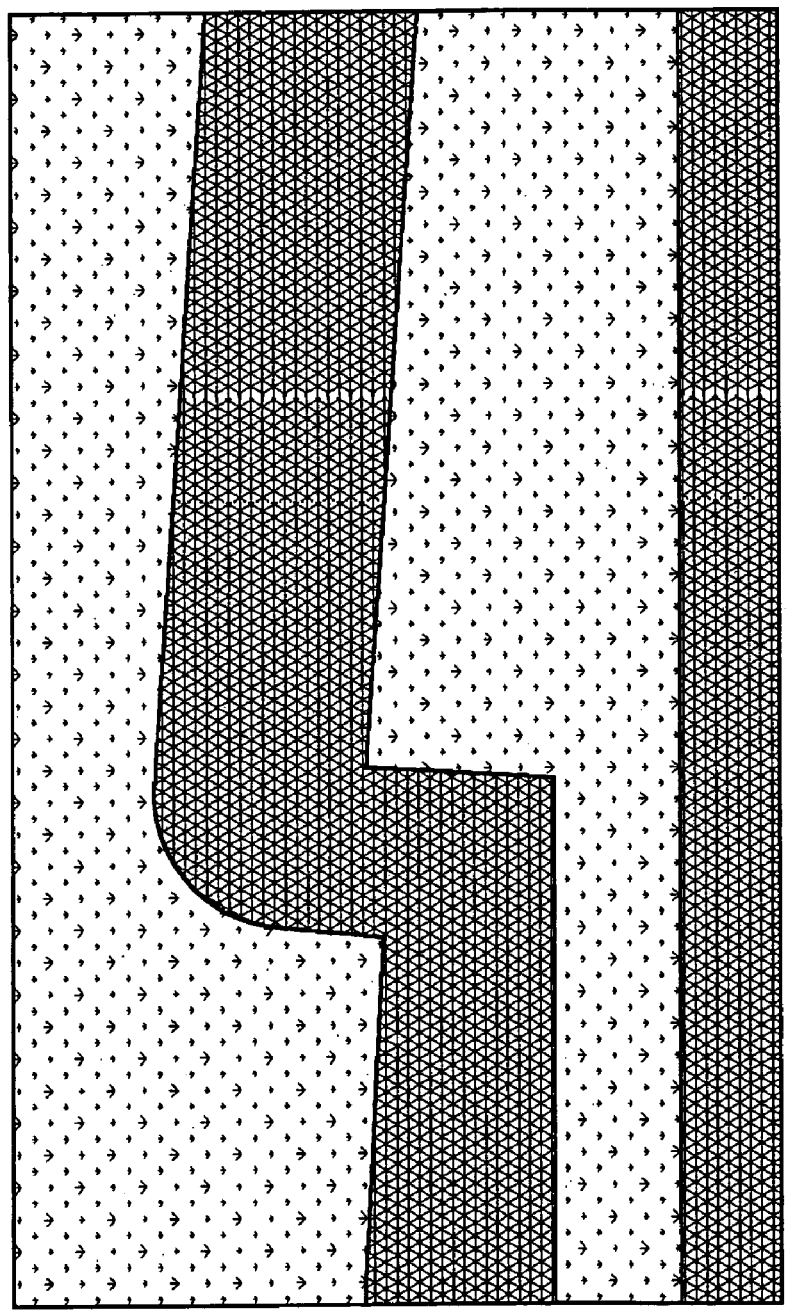
FIG. 14B shows a scanning electron micrograph of an actual step coverage profile of DC reactively sputtered SiO2, with excellent step coverage of about 60%.

FIG. 14A shows a theoretical simulation of an insulating film such as silicon dioxide or aluminum oxide, conventionally deposited by RF sputtering from a compound target, exhibiting the poor step coverage typically seen in the prior art. FIG. 14B shows a scanning electron micrograph of a DC reactively deposited SiO2 film with conformal step coverage as taught by the present invention.

We claim:

1. A sweeping linear magnetron comprising a cathode backing plate, said cathode backing plate having an exterior surface adapted to be attached to a vacuum chamber wherein a plasma deposition process will occur; a drive housing attached to said exterior surface of said cathode backing plate, said drive housing positioned over a cut-out in the surface of said cathode backing plate; a motor held in said drive housing, said motor driving a yoke, said yoke positioned within said cut-out in said surface of said cathode backing plate; a magnet pack, said magnet pack attached to said yoke, said magnet pack having a first magnet mounting plate and a second magnet mounting plate that goes over the first magnet mounting plate and a plurality of magnets positioned between said first magnet mounting plate and said second magnet mounting plate, said magnet mounting plates have at least one side edge and at least one end edge, said magnet pack having between the first magnet mounting plate and the second magnet mounting plate one or more center magnets having a first end and a second end and a body between said first end and said second end and one or more side magnets having a first end and a second end and a body between said first end and said second end, said side magnets being positioned along said side edge and one or more end magnets positioned along said end edge, the bodies of said center magnets and said side magnets generally positioned in the same alignment so that their ends do not contact each other and one or more end magnets on the magnet mounting plates in an area of the magnet mounting plates that extends past the ends of the center and side magnet; and wherein one or more filler magnets are positioned between the body of the center magnets and the body of the side magnets.

2. The magnetron according to claim 1 wherein one or more end magnets extend from one end of one side magnet to one end of a second side magnet.

3. The magnetron according to claim 2 wherein one or more end magnets form an arc that extends from one end of one side magnet to one end of a second side magnet along the end edge of said magnet mounting plates.

4. The magnetron according to claim 2 wherein the end magnets act as a shunt for the magnetic flux.

5. The magnetron according to claim 4 wherein the end magnets are fixed to the magnet mounting plate with their south poles facing said target material.

6. The magnetron according to claim 5 wherein the side magnets have their north poles facing said target material.

7. The magnetron according to claim 6 wherein the center magnets have their south poles facing said target material.

8. The magnetron according to claim 7 wherein one or more filler magnets may be oriented such that their north poles contact the side magnets, while their south poles contact the center magnets.

9. The magnetron according to claim 1 wherein said magnet pack moves linearly across a width of said target material.

10. The magnetron according to claim 1 wherein said magnet pack moves linearly across a length of said target material.

11. The magnetron according to claim 1 wherein said motor is a frequency actuator.

12. The magnetron according to claim 1 wherein said motor is an air cylinder.

13. A sweeping linear magnetron comprising a cathode backing plate, said cathode backing plate having an exterior surface adapted to be attached to a vacuum chamber wherein a plasma deposition process will occur; a drive housing attached to said exterior surface of said cathode backing plate, said drive housing positioned over a cut-out in the surface of said cathode backing plate; a motor held in said drive housing, said motor driving a yoke, said yoke positioned within said cut-out in said surface of said cathode backing plate; a magnet pack, said magnet pack attached to said yoke, said magnet pack having a first magnet mounting plate having a plurality of cooling fins disposed on said magnet mounting plate and a second magnet mounting plate that goes over the first magnet mounting plate and a plurality of magnets positioned between said first magnet mounting plate and said second magnet mounting plate, said magnet pack having between the first magnet mounting plate and the second magnet mounting plate one or more center magnets having a first end and a second end and a body between said first end and said second end and one or more side magnets having a first end and a second end and a body between said first end and said second end, the bodies of said center magnets and said side magnets generally, positioned in the same alignment so that their ends do not contact each other and one or more end magnets on the magnet mounting plates in an area of the magnet mounting plates that extends past the ends of the center and side magnet.

14. The magnetron according to claim 1 wherein a plurality of cooling fins are disposed on each of said magnet mounting plates.

15. The magnetron according to claim 13 wherein one or more end magnets extend from one end of one side magnet to one end of a second side magnet.

16. The magnetron according to claim 15 wherein one or more end magnets form an arc that extends from one end of one side magnet to one end of a second side magnet along the end edge of said magnet mounting plates.

17. The magnetron according to claim 16 wherein the end magnets act as a shunt for the magnetic flux.

18. The magnetron according to claim 17 wherein the end magnets are fixed to the magnet mounting plate with their south poles facing said target material.

19. The magnetron according to claim 18 wherein the side magnets have their north poles facing said target material.

20. The magnetron according to claim 19 wherein the center magnets have their south poles facing said target material.

21. The magnetron according to claim 20 wherein one or more filler magnets may be oriented such that their north poles contact the side magnets, while their south poles contact the center magnets.

22. The magnetron according to claim 13 wherein said magnet pack moves linearly across a width of said target material.

23. The magnetron according to claim 13 wherein said magnet pack moves linearly across a length of said target material.

24. The magnetron according to claim 13 wherein said motor is a frequency actuator.

25. The magnetron according to claim 13 wherein said motor is an air cylinder.

* * * * *